(12) United States Patent
Meguro et al.

(10) Patent No.: US 9,865,762 B2
(45) Date of Patent: Jan. 9, 2018

(54) THIN-FILM PHOTOELECTRIC CONVERSION DEVICE AND METHOD FOR MANUFACTURING SAME

(71) Applicant: KANEKA CORPORATION, Osaka-shi, Osaka (JP)

(72) Inventors: Tomomi Meguro, Settsu (JP); Kenji Yamamoto, Settsu (JP)

(73) Assignee: KANEKA CORPORATION, Osaka-shi, Osaka (JP)

( * ) Notice: Subject to any disclaimer, the term of this patent is extended or adjusted under 35 U.S.C. 154(b) by 198 days.

(21) Appl. No.: 14/430,540

(22) PCT Filed: Sep. 27, 2013

(86) PCT No.: PCT/JP2013/076331
§ 371 (c)(1),
(2) Date: Mar. 23, 2015

(87) PCT Pub. No.: WO2014/051078
PCT Pub. Date: Apr. 3, 2014

(65) Prior Publication Data
US 2015/0221802 A1 Aug. 6, 2015

(30) Foreign Application Priority Data
Sep. 28, 2012 (JP) .................. 2012-218594

(51) Int. Cl.
*H01L 31/0224* (2006.01)
*H01L 31/077* (2012.01)
(Continued)

(52) U.S. Cl.
CPC ...... *H01L 31/077* (2013.01); *H01L 31/02366* (2013.01); *H01L 31/022483* (2013.01);
(Continued)

(58) Field of Classification Search
CPC ........... H01L 31/077; H01L 31/022483; H01L 31/03765; H01L 31/1804; H01L 31/1889;
(Continued)

(56) References Cited

U.S. PATENT DOCUMENTS 5,853,498 A 12/1998 Beneking et al.
2001/0037824 A1 11/2001 Sano et al.
(Continued)

FOREIGN PATENT DOCUMENTS

JP H04369870 A 12/1992
JP 2001244488 A 9/2001
(Continued)

OTHER PUBLICATIONS

Ganguly et al., Improved fill factors in amorphous silicon solar cells on zinc oxide by insertion of a germanium layer to block impurity incorporation, Applied Physics Letters, vol. 65, No. 1, pp. 479-481 (2004).*

(Continued)

*Primary Examiner* — Jayne Mershon
(74) *Attorney, Agent, or Firm* — Alleman Hall Creasman & Tuttle LLP (57) ABSTRACT

The thin-film photoelectric conversion device of the present invention includes: a transparent electroconductive film having zinc oxide as a main component; a contact layer; a photoelectric conversion unit having a p-type semiconductor layer, an i-type semiconductor layer and an n-type semiconductor layer in this order; and a back electrode layer, in this order, on one main surface of a substrate. The contact layer has an intrinsic crystalline semiconductor layer and a p-type crystalline semiconductor layer in this order from the substrate side, and the intrinsic crystalline semiconductor layer of the contact layer and the transparent electroconductive film are in contact with each other. The p-type crystalline (Continued)

semiconductor layer of the contact layer is preferably a layer having as a main component a silicon alloy selected from the group consisting of a silicon oxide; a silicon nitride; and silicon carbide.

12 Claims, 4 Drawing Sheets (51) Int. Cl.
| | |
|---|---|
| *H01L 31/0236* | (2006.01) |
| *H01L 31/0392* | (2006.01) |
| *H01L 31/0376* | (2006.01) |
| *H01L 31/18* | (2006.01) |
| *H01L 31/076* | (2012.01) |
| *H01L 31/0368* | (2006.01) |
| *H01L 31/075* | (2012.01) |
| *H01L 31/0745* | (2012.01) |
| *H01L 31/0747* | (2012.01) |

(52) U.S. Cl.
CPC .. *H01L 31/03685* (2013.01); *H01L 31/03762* (2013.01); *H01L 31/03765* (2013.01); *H01L 31/03921* (2013.01); *H01L 31/075* (2013.01); *H01L 31/076* (2013.01); *H01L 31/0745* (2013.01); *H01L 31/0747* (2013.01); *H01L 31/1804* (2013.01); *H01L 31/1888* (2013.01); *Y02E 10/545* (2013.01); *Y02E 10/548* (2013.01)

(58) Field of Classification Search
CPC ......... H01L 31/02366; H01L 31/03921; H01L 31/1888; H01L 31/076
USPC ....................................................... 136/255
See application file for complete search history.

(56) References Cited

U.S. PATENT DOCUMENTS

| | | |
|---|---|---|
| 2003/0205269 A1 | 11/2003 | Sano et al. |
| 2007/0209699 A1 | 9/2007 | Sichanugrist et al. |
| 2014/0004651 A1* | 1/2014 | Fogel .............. H01L 31/022425 438/87 |

FOREIGN PATENT DOCUMENTS

| | | | |
|---|---|---|---|
| JP | 2001291878 A | | 10/2001 |
| JP | 2002222975 A | | 8/2002 |
| JP | 2008-124325 | * | 5/2008 |
| JP | 2008124325 A | | 5/2008 |
| JP | 2011066213 A | | 3/2011 |
| JP | 2012-174735 | * | 9/2012 |
| JP | 2012174735 A | | 9/2012 |
| WO | 2009157447 A1 | | 12/2009 |
| WO | 2014004426 A1 | | 1/2014 |

OTHER PUBLICATIONS

Chang, P. et al., "Development of high efficiency p-i-n amorphous silicon solar cells with the p-mu c-Si:H/p-a-SiC:H double window layer," Solar Energy Materials & Solar Cells, vol. 95, No. 9, Sep. 2011, Available Online Jun. 2, 2011, 5 pages.

European Patent Office, Extended European Search Report Issued in Application No. 13841155.8, dated May 6, 2016, Germany, 14 pages.

International Bureau of WIPO, International Preliminary Report on Patentability Issued in Application No. PCT/JP2013/076331, dated Apr. 9, 2015, WIPO, 6 pages.

ISA Japanese Patent Office, International Search Report Issued in Application No. PCT/JP2013/076331, dated Dec. 10, 2013, WIPO, 4 pages.

* cited by examiner

THIN-FILM PHOTOELECTRIC CONVERSION DEVICE AND METHOD FOR MANUFACTURING SAME

TECHNICAL FIELD

The present invention relates to a thin-film photoelectric conversion device and a method for manufacturing the same.

BACKGROUND ART

A thin-film photoelectric conversion device having a silicon thin film etc. as a photoelectric conversion layer includes a thin-film photoelectric conversion unit having on a transparent electroconductive film a p-type semiconductor layer, an i-type semiconductor layer (photoelectric conversion layer) and an n-type semiconductor layer in this order.

Generally, a transparent electroconductive film having an irregular structure on a surface thereof is used for enhancing the efficiency of the utilization of incident light by light trapping. As a material of the transparent electroconductive film, a conductive oxide such as tin oxide is widely used. In recent years, zinc oxide has also come into use as a transparent electroconductive film of a thin-film photoelectric conversion device. Zinc oxide has a high transmittance to light in a long wavelength range, making it easy to control a haze ratio as an index of the light trapping effect, and is excellent in anti-reduction properties to hydrogen radicals. A method has been proposed in which a substrate with a pyramid-shaped or inverted pyramid-shaped underlying layer formed on a transparent substrate is provided, and a zinc oxide transparent electroconductive film is formed thereon to utilize a larger amount of incident light (see, for example, Patent Document 1).

Preferably, conductivity-type layers (p-type semiconductor layer and n-type semiconductor layer) of the thin-film photoelectric conversion unit have a high electroconductivity. Preferably, the p-type semiconductor layer has small light absorption because it is a layer disposed on the light incident side of an i-type semiconductor layer. For the p-type semiconductor layer, a p-type amorphous silicon carbide or the like is used.

It is known that the use of zinc oxide as a transparent electroconductive film causes an increase in contact resistance at the interface between a transparent electroconductive film and a p-type semiconductor layer, and a deterioration of ohmic characteristics, leading to a decrease in open circuit voltage (Voc) and fill factor (FF), and particularly, when amorphous silicon carbide is used as a p-type semiconductor layer of a photoelectric conversion unit, this tendency is noticeable. For solving the above-mentioned problem, an attempt has been made to form a contact layer between a zinc oxide layer and a p-type semiconductor layer of a photoelectric conversion unit in order to reduce the contact resistance between both layers.

For example, it is known that, when a p-type crystalline silicon layer as a contact layer is provided between a p-type semiconductor layer and a transparent electroconductive film, the contact resistance at the junction interface between the zinc oxide transparent electroconductive film and the p-type semiconductor layer is reduced. However, since p-type silicon in the contact layer is hard to be crystallized, it is difficult to sufficiently reduce the contact resistance.

Patent Document 2 discloses a method in which, as a contact layer, a first p-type crystalline semiconductor layer having a small impurity amount (dope amount) is formed, film formation is then suspended, and a second p-type crystalline semiconductor layer having a large impurity amount is formed on the first p-type crystalline semiconductor layer. According to this method, the degree of crystallization of the second p-type crystalline semiconductor layer is improved, so that a proper interface junction can be formed between a transparent electroconductive film and a thin-film photoelectric conversion unit.

It is known that the use of zinc oxide as a transparent electroconductive film causes zinc atoms to be easily diffused into a semiconductor layer (silicon layer), so that zinc forms a defect level as an impurity in the semiconductor layer, leading to a reduction in power generation efficiency. Patent Document 3 describes that a layer containing a silicon oxide is formed between a transparent electroconductive film (zinc oxide layer) and a semiconductor layer to suppress the diffusion of zinc atoms into the semiconductor layer.

PRIOR ART DOCUMENTS

Patent Documents

Patent Document 1: WO 2009/157447
Patent Document 2: JP-A-2008-124325
Patent Document 3: JP-A-2001-244488

SUMMARY OF THE INVENTION

Problems to be Solved by the Invention

When a contact layer composed of a p-type layer of a two-layer structure is formed as in Patent Document 2, the thickness of the p-type layer as a contact layer increases, so that light absorption by a p-type conductivity-type determining impurity tends to increase, leading to a reduction in the short circuit current density (Jsc). In Patent Document 3, there is the problem that it is difficult to secure an ohmic junction between a silicon oxide used as a contact layer and a transparent electroconductive film (zinc oxide), leading to a decrease in Voc, FF, and so on.

When a zinc oxide transparent electroconductive film is formed on an underlying layer having irregularities as in Patent Document 1, Jsc is improved due to a high light trapping effect, but the coverage of a contact layer and a photoelectric conversion unit formed on the zinc oxide transparent electroconductive film having surface irregularities tends to be deteriorated, leading to a decrease in Voc and FF.

When zinc oxide is used as a transparent electroconductive film of a thin-film photoelectric conversion device as described above, improvements in anti-reduction properties and a high light trapping effect by surface irregularities can be expected, but currently, the interface junction between zinc oxide and a photoelectric conversion unit cannot be sufficiently improved. A method capable of achieving both an improvement of Jsc due to a high light trapping effect and improvement of Voc and FF by improvement of the interface junction and the coverage has not been found yet.

Means for Solving the Problems

As a result of conducting studies in view of the above-mentioned problems in the prior arts, it has been found that, when a specific contact layer is formed between a transparent electroconductive film having zinc oxide as a main component and a thin-film photoelectric conversion unit, a proper junction interface is formed, so that a thin-film photoelectric conversion device having high conversion efficiency is obtained.

The present invention relates to a thin-film photoelectric conversion device including: a transparent electroconductive film having zinc oxide as a main component; a contact layer; a photoelectric conversion unit having a p-type semiconductor layer, an i-type semiconductor layer and an n-type semiconductor layer in this order; and a back electrode layer, in this order, on one main surface of a substrate. The contact layer has an intrinsic crystalline semiconductor layer and a p-type crystalline semiconductor layer in this order from the substrate side, and the intrinsic crystalline semiconductor layer and the transparent electroconductive film are in contact with each other. The p-type crystalline semiconductor layer of the contact layer is preferably a layer having as a main component a silicon alloy selected from a group consisting of a silicon oxide; a silicon nitride; silicon carbide; and silicon germanium, and especially preferably a layer having a silicon oxide as a main component.

Preferably, the p-type crystalline semiconductor layer of the contact layer has a thickness of 3 to 15 nm. Preferably, the p-type crystalline semiconductor layer of the contact layer has a dark conductivity of $10^{-8}$ to $10^{-1}$ S/cm, and a refractive index of 1.7 to 3.0 to light having a wavelength of 600 nm. Preferably, the intrinsic crystalline semiconductor layer of the contact layer has a thickness of 0.2 to 5 nm.

In one embodiment of the present invention, the substrate includes a transparent insulating base and an underlying layer. The underlying layer is formed on the transparent electroconductive film side of the transparent insulating base, and has an irregular structure on a surface on the transparent electroconductive film side. Preferably, the irregular structure of the underlying layer has a top-bottom distance of 100 to 1000 nm, and a projection peak-to-peak distance of 200 to 2000 nm.

In the present invention, the p-type semiconductor layer of the photoelectric conversion unit is preferably a p-type amorphous silicon carbide layer. Preferably, the p-type amorphous silicon carbide layer of the photoelectric conversion unit is in contact with the p-type crystalline semiconductor layer of the contact layer.

One embodiment of the thin-film photoelectric conversion device of the present invention further includes another photoelectric conversion unit between the photoelectric conversion unit and the back electrode layer.

The present invention relates to a solar cell module including the photoelectric conversion device.

Further, the present invention relates to a method of manufacturing the photoelectric conversion device. In the manufacturing method of the present invention, it is preferred that the intrinsic crystalline semiconductor layer and the p-type crystalline semiconductor layer of the contact layer are formed by a plasma-enhanced CVD method.

In the manufacturing method of the present invention, it is preferred that after a transparent electroconductive film having zinc oxide as a main component is formed, a surface thereof is subjected to an etching treatment. The etching treatment is preferably plasma etching.

Effects of the Invention

According to the present invention, a contact layer having an intrinsic crystalline semiconductor layer and a p-type crystalline semiconductor layer is formed between zinc oxide and a p-type semiconductor layer of a thin-film photoelectric conversion unit, so that the short circuit current density can be improved by light trapping while proper contact characteristics are maintained. Thus, according to the present invention, the characteristics of a thin-film photoelectric conversion device, including a zinc oxide transparent electroconductive film, are improved.

BRIEF DESCRIPTION OF THE DRAWINGS

FIGS. 2A and 2B are views showing one aspect of a mold for use in the present invention, where

MODE FOR CARRYING OUT THE INVENTION

Preferred embodiments of the present invention will be described below with reference to the drawings. In the drawings in the present application, dimensional relations of thickness, length and so on are appropriately changed for clarification and simplification of the drawings, and do not reflect actual dimensional relations.

Figure 1:
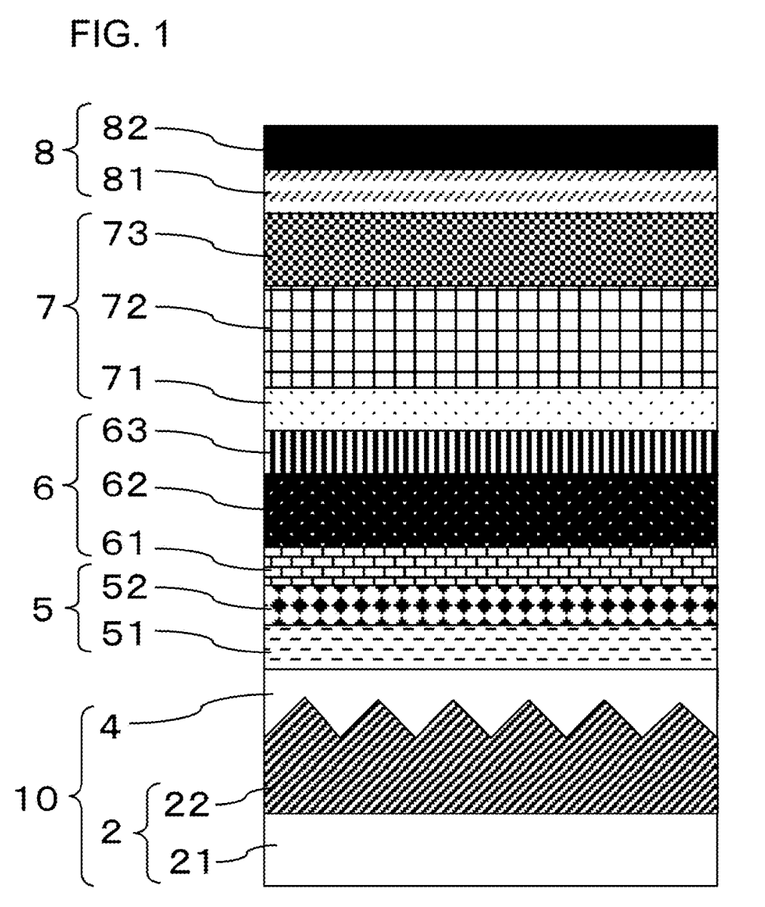
FIG. 1 is a schematic sectional view of a double-junction-type thin-film silicon solar cell (thin-film photoelectric conversion device) of one aspect of the present invention.

FIG. 1 is a schematic sectional view of a thin-film photoelectric conversion device of one embodiment of the present invention. The thin-film photoelectric conversion device in FIG. 1 includes on a substrate 2 a transparent electroconductive film 4, a contact layer 5, an amorphous photoelectric conversion unit 6, a crystalline photoelectric conversion unit 7 and a back electrode layer 8 in this order. In this specification, the term "crystalline" encompasses "polycrystalline" and "microcrystalline", and may partially include "amorphous". In this specification, one having the transparent electroconductive film 4 on one main surface of the substrate 2 may be referred to as a "substrate with a transparent electroconductive film".

[Substrate]

The substrate 2 includes a transparent insulating base 21. As the transparent insulating base 21, a plate-shaped member or sheet-shaped member composed of glass, a transparent resin, or the like is used. As shown in FIG. 1, the substrate 2 preferably includes on one main surface of the transparent insulating base 21 an underlying layer 22 having a surface irregular structure. Since the underlying layer 22 has a surface irregular structure, the utilization efficiency of incident light is enhanced.

The shape of the irregular structure is preferably a pyramid shape or an inverted pyramid shape. The projection portions of the irregular structure are preferably continuous. Here, the term "continuous" means a state in which irregularities are adjacent with one another without having flat portions. The irregular structure may be periodic or non-periodic. The irregular structure is preferably non-periodic for trapping light in a wide wavelength range.

The underlying layer may be partially free of irregular structures. For example, when the thin-film photoelectric conversion device is integrated by laser scribing, it is preferred that irregularities are not formed on a region to be subjected to laser processing, i.e. a non-power-generation region.

The top-bottom distance of the irregular structure in the texture of the underlying layer 22 is preferably 100 to 1000 nm, more preferably 200 to 800 nm, and further preferably 500 to 700 nm. The projection peak-to-peak distance is preferably 200 to 2000 nm, more preferably 300 to 1200 nm, and further preferably 500 to 800 nm. When the size of the irregular structure falls within the above-mentioned range, light having a wavelength of 300 to 1200 nm, which can be used by a solar cell of a thin-film silicon type etc., particularly light on the long wavelength side, which has a wavelength of 700 nm or more, is effectively scattered, and light utilization efficiency tends to be enhanced due to a reduction of reflection at the interface. The haze ratio (=diffuse transmittance/total light transmittance) of the underlying layer 22 is preferably 10% or more, more preferably 30% or more, and further preferably 40% or more. The haze ratio of the underlying layer is preferably 80% or less, and more preferably 60% or less.

The underlying layer 22 preferably has transparency, and preferably has a small refractive index difference between itself and the transparent insulating base 21 for reducing reflection at the interface with the transparent insulating base 21. As a material thereof, a thermosetting or photocurable material such as an inorganic sol-gel material, an organic polymer material, or an organic-inorganic hybrid material containing an alkoxide and an oxide of metal such as titanium, or the like is suitably used.

Figure 2A:
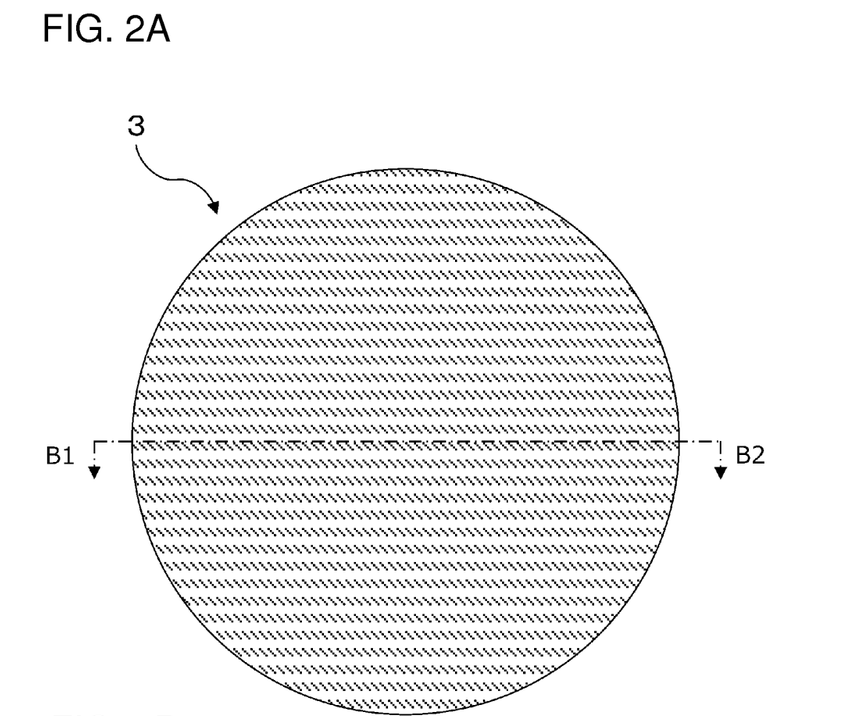
FIG. 2A is a plan view.
Figure 2B:
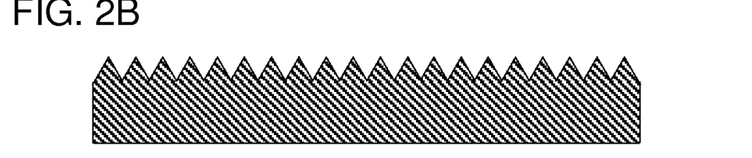
FIG. 2B is a sectional view.

The method for forming a texture structure is not particularly limited, and various kinds of methods can be employed. Particularly, a nanoimprinting method is desirable in view of ease and reproducibility of controlling the shape of a texture structure, and manufacturing cost. In the nanoimprinting method, a texture structure having a light scattering property can be formed by pressing a mold, on which a texture structure is formed, against a substrate after the formation of an underlying layer. FIGS. 2A and 2B are views showing one example of a mold 3 to be used in the nanoimprinting method, where FIG. 2A is a plan view, and FIG. 2B is a sectional view taken along line B1-B2.

[Transparent Electroconductive Film]

The transparent electroconductive film 4 having zinc oxide as a main component is formed on the substrate 2. Here, in this specification, the phrase "as a main component" means that a certain component is contained in an amount of more than 50%, preferably of 70% or more, and more preferably of 90% or more. When a transparent electroconductive film having zinc oxide as a main component is used, a high transmittance, and plasma resistance during the formation of a semiconductor layer on the transparent electroconductive film by CVD etc. can be expected.

The transparent electroconductive film 4 is formed using a method such as CVD, sputtering or vapor deposition. Particularly, it is preferred that the zinc oxide transparent electroconductive film is formed by CVD because a texture can be easily formed on a surface of the transparent electroconductive film on the thin-film photoelectric conversion unit side in parallel to the film formation. The transparent electroconductive film 4 may be composed of a single layer, or may be formed by stacking a plurality of layers.

When a zinc oxide transparent electroconductive film is formed by a CVD method on the substrate 2 having the underlying layer 22 provided with an irregular structure, the transparent electroconductive film 4 reflects the profile of the irregular structure of the underlying layer, and irregularities finer than the irregular structure of the underlying layer can be generated on a surface of the transparent electroconductive film 4. Consequently, an effect of further increasing the scattering of incident light can be expected. For example, when the front photoelectric conversion unit 6 is an amorphous silicon photoelectric conversion unit, and the rear photoelectric conversion unit 7 is a crystalline silicon photoelectric conversion unit, small irregularities with the transparent electroconductive film increase scattering of light on the short wavelength side, so that the spectral response of the front photoelectric conversion unit can be improved, and large irregularities with the underlying layer increase the scattering of light on the long wavelength side, so that the spectral response of the rear photoelectric conversion unit can be improved.

The arithmetic mean roughness (Ra) of the surface of the transparent electroconductive film 4 is preferably 50 to 120 nm, and more preferably 70 to 120 nm. The surface area ratio (Sdr) of the transparent electroconductive film 4 is preferably not less than 10% and not more than 30%, and more preferably not less than 15% and not more than 25%. When Ra and Sdr each fall within the above-mentioned range, occurrence of line defects from recess portions and reduction of the coverage by the steep projection portions are suppressed because the shape of recess portions and projection portions on the surface of the transparent electroconductive film is smoother.

Here, the arithmetic mean roughness (Ra) for a three-dimensional irregularity shape is defined by the following Formula 1, where Z is a height in a direction crossing orthogonal to the substrate surface, and Zave is an average value of the heights. The surface area ratio (Sdr) is defined by the following Formula 2, and is a parameter showing an increase ratio of the surface with respect to the sampling surface, and Sdr increases as irregularities become sharper and closer to a V shape.

[Formula 1]

$$R_a = \frac{1}{MN} \sum_{j=1}^{M} \sum_{k=1}^{N} |Z(x_j, y_k) - Z_{ave}| \qquad (1)$$

[Formula 2]

$$Sdr = \frac{1}{A}\left[\int\int_A \sqrt{\left[1 + \left(\frac{\partial Z(xy)}{\partial x}\right)^2 + \left(\frac{\partial Z(xy)}{\partial y}\right)^2\right]} - 1 dx dy\right] \qquad (2)$$

where; A = definition area

In the present invention, it is preferred that, after the transparent electroconductive film is formed, the surface thereof is etched by a chemical or physical method for ensuring that Ra and Sdr of the transparent electroconductive film each fall within the above-mentioned range. By etching, the V shape of the recess portions of the irregular structure is moderated into a U shape, and steep protrusions of the projection portions are rounded, so that Ra and Sdr are each adjusted to fall within the above-mentioned range.

Examples of the etching method include mechanical methods such as polishing and blasting, physical methods such as RIE (reactive ion etching), CVD and laser ablation, and chemical methods using an etchant such as an acid or alkali solution. Particularly, plasma etching by RIE is preferred because the shape of recess portions can be easily changed. By appropriately setting plasma irradiation conditions during etching and an etching time, Ra and Sdr can be each adjusted to fall within the above-mentioned range.

The top-bottom distance of the irregular structure of the surface of the transparent electroconductive film 4 is preferably 20 to 400 nm, and more preferably 100 to 300 nm. The projection peak-to-peak distance of the irregular structure is preferably 50 to 1000 nm, and more preferably 300 to 700 nm. When the size of the irregular structure falls within the above-mentioned range, particularly light on the long wavelength side, which has a wavelength of 700 nm or more, is effectively scattered.

For improving the characteristics of the photoelectric conversion device, the sheet resistance of the transparent electroconductive film 4 is preferably 5 to 20 Ω/sq, and more preferably 10 to 15 Ω/sq. The thickness of the transparent electroconductive film 4 is preferably 1.0 to 2.5 µm, and more preferably 1.2 to 2.0 µm. When the thickness of the transparent electroconductive film falls within the above-mentioned range, improvement of electrical characteristics can be expected as a film having a low resistance while maintaining transparency. In this specification, unless otherwise specified, the thickness of a film having irregularities means a thickness (distance between interfaces) in a direction perpendicular to the slope of the irregularities.

Thus, a substrate with a transparent electroconductive film 10, which includes the transparent electroconductive film 4 on the substrate 2, is formed. The haze ratio of the substrate with a transparent electroconductive film is preferably 5 to 80%, and more preferably 35 to 80%. When the haze ratio of the substrate with a transparent electroconductive film falls within the above-mentioned range, a high light scattering effect is obtained, and reduction of the coverage of the contact layer 5, the photoelectric conversion unit 6 and so on formed on the substrate is suppressed.

[Contact Layer]

The contact layer 5 having an intrinsic crystalline semiconductor layer 51 and a p-type crystalline semiconductor layer 52 is formed on the substrate with a transparent electroconductive film 10.

The intrinsic crystalline semiconductor layer 51 is formed of, for example, silicon, or a silicon alloy such as silicon carbide, a silicon oxide, a silicon nitride or silicon germanium. Particularly, silicon is suitably used as a material of the intrinsic crystalline semiconductor layer because silicon is easily crystallized even when the thickness is small. Since the intrinsic crystalline semiconductor layer 51 is not doped with an impurity, it is difficult to increase the electroconductivity thereof. Thus, for suppressing a reduction in electroconductivity, the thickness of the intrinsic crystalline semiconductor layer 51 is preferably as small as possible. The thickness of the intrinsic crystalline semiconductor layer 51 is preferably 0.2 to 5 nm, and more preferably 0.5 to 3 nm. The intrinsic crystalline semiconductor layer 51 may cover the whole of the surface of the transparent electroconductive film 4, or may be in the form of islands, i.e. the intrinsic crystalline semiconductor layer 51 may be partially absent on the surface of the transparent electroconductive film 4. Preferably, the refractive index of the intrinsic crystalline semiconductor layer 51 at a wavelength of 600 nm is a standard value as a microcrystalline silicon layer, i.e. about 3.0 to 3.6.

The method for forming the intrinsic crystalline semiconductor layer 51 is not particularly limited, but a CVD method is preferred, and a plasma-enhanced CVD method is especially preferred because a crystalline film with high quality can be formed. For example, when crystalline silicon is deposited as the intrinsic crystalline semiconductor layer 51, silicon can be crystallized by introducing silane and hydrogen as film formation gases and increasing the hydrogen dilution amount like general microcrystalline silicon film formation conditions.

The p-type crystalline semiconductor layer 52 can be formed by, for example, doping a silicon alloy material such as silicon carbide, a silicon oxide, a silicon nitride or silicon germanium with p-type conductivity-type determining impurity atoms such as those of boron or aluminum. It is preferred to use boron as a dope atom because boron has a high activity as a dopant. As a material of the p-type crystalline semiconductor layer 52, a silicon alloy is preferred as described above because such a silicon alloy provides a proper coverage even when the transparent electroconductive film 4 and the intrinsic crystalline semiconductor layer 51 formed thereon have surface irregularities, has small light absorption, and has a proper contact property with a p-type amorphous semiconductor layer 61 (e.g. amorphous silicon carbide layer) of the photoelectric conversion unit 6. A silicon oxide and a silicon nitride are preferred. Particularly, one having a silicon oxide as a main component is preferably used because it has small light absorption and exhibits a high electroconductivity.

The thickness of the p-type crystalline semiconductor layer 52 is preferably 3 to 15 nm, and more preferably 5 to 10 nm for reducing an absorption loss while maximizing a function as a contact layer.

The dark conductivity of the p-type crystalline semiconductor layer 52 is preferably not less than $10^{-8}$ S/cm and not more than $10^{-1}$ S/cm, more preferably not less than $10^{-5}$ S/cm and not more than $10^{-3}$ S/cm. Here, the term "dark conductivity" means an electroconductivity measured under a dark condition in which light is not applied. When the p-type layer of the contact layer is a crystalline semiconductor layer, the dark conductivity can be made to fall within the above-mentioned range to suppress the deterioration of the characteristics of the solar cell due to an increase in the series resistance component. As a result, a proper electrical junction having an ohmic property can be formed between the transparent electroconductive film 4 and the p-type amorphous semiconductor layer 61 composed of a p-type amorphous silicon carbide etc.

The p-type crystalline semiconductor layer 52 has a refractive index of preferably 1.7 to 3.0, and more preferably 2.0 to 3.0 to light having a wavelength of 600 nm. The refractive index of the transparent electroconductive film 4 composed of zinc oxide is about 1.8 to 2.0, and the refractive index of the p-type amorphous semiconductor layer 61 of the photoelectric conversion unit 6 formed on the contact layer 5 is generally 3.0 or more. When the refractive index of the p-type crystalline semiconductor layer 52 falls within the above-mentioned range, the refractive index is a value lying between the refractive indexes of the transparent electroconductive film 4 and the p-type amorphous semiconductor layer 61, and therefore reflection at the interface is reduced, so that light utilization efficiency is enhanced.

The method for forming the p-type crystalline semiconductor layer 52 is not particularly limited, but a CVD method is preferred, and a plasma-enhanced CVD method is especially preferred because a crystalline film with high quality can be formed. Film formation conditions can be appropriately adjusted by a material of the p-type crystalline semiconductor layer, and the like. For example, when the p-type crystalline semiconductor layer 52 having a silicon oxide as a main component is formed, it is preferred to form a film by a plasma-enhanced CVD method using a silane-based gas and carbon dioxide as raw material gases.

When the p-type crystalline silicon oxide layer is formed by a plasma-enhanced CVD method, the film formation pressure is preferably 660 to 1330 Pa, and more preferably 800 to 1000 Pa. The substrate temperature is preferably 170 to 220° C., and more preferably 180 to 200° C. The film formation power density is preferably 0.05 to 1 W/cm$^2$, and more preferably 0.1 to 0.5 W/cm$^2$.

The introduction amount of hydrogen gas with respect to silane is preferably 300 to 1000 times, and more preferably 500 to 800 times. The introduction amount of carbon dioxide with respect to silane is preferably 2 to 4 times, and more preferably 2 to 3 times. The introduction amount of diborane with respect to silane is preferably more than 0% and not more than 5%, and more preferably 1 to 4%. That is, as film formation gases, it is preferred to introduce hydrogen in an amount of 300 to 1000 times, carbon dioxide in an amount of 2 to 4 times and diborane gas in an amount of more than 0% and not more than 5% with respect to silane. It is more preferred to introduce hydrogen in an amount of 500 to 800 times, carbon dioxide in an amount of 2 to 3 times and diborane gas in an amount of 1 to 4% with respect to silane. By forming a film under such conditions, a p-type crystalline silicon oxide layer having the above-described refractive index and dark conductivity is obtained.

It has been previously proposed that a p-type silicon oxide layer is formed between zinc oxide and silicon carbide as described above, but in conventional techniques, a p-type silicon oxide layer having electroconductivity available as a contact layer has not been obtained because silicon oxide is hard to be crystallized. On the other hand, in the present invention, by forming the p-type crystalline semiconductor layer 52 on the intrinsic crystalline semiconductor layer 51, the crystallization rate can be increased even when the p-type crystalline semiconductor layer has a silicon oxide as a main component.

This may be because the intrinsic crystalline semiconductor layer 51 formed on the transparent electroconductive film 4 does not have a dope impurity, and therefore hindrance of crystallization by a dope impurity as is seen during formation of a p-type layer is suppressed, so that a large number of crystal nuclei are generated even in an extremely thin layer having a thickness of 5 nm or less. The intrinsic crystalline semiconductor layer 51 serves as a seed layer for promoting the crystallization of a semiconductor layer formed thereon, and therefore crystallization of the p-type crystalline semiconductor layer 52 may be promoted to the extent that crystallization is promoted as compared to a case where a p-type layer is formed directly on a transparent electroconductive film, so that a high electroconductivity may be exhibited. Thus, the total thickness of the contact layer can be set to about 3 to 20 nm, so that the film quality of the contact layer and the photoelectric conversion unit formed thereon can be improved while a light absorption loss caused by the contact layer is minimized.

As described above, in the present invention, by forming the p-type crystalline semiconductor layer 52 on the intrinsic crystalline semiconductor layer 51 under specific conditions, crystallinity and transparency thereof can be improved. Particularly, when as a p-type crystalline semiconductor layer, one having a silicon oxide as a main component is used, improvement of crystallinity and transparency, which has been difficult in conventional techniques, can be achieved, and in addition, the refractive index can be adjusted to reduce reflection at the interface. Further, since a silicon oxide has a proper coverage, Voc and FF are improved to enhance conversion efficiency.

Further, in the present invention, the contact layer 5 is provided between the transparent electroconductive film 4 and the photoelectric conversion unit 6, so that in addition to initial conversion characteristics, conversion characteristics after photostabilization tend to be improved (photodegradation tends to be reduced). This may be because, since the contact layer 5 has a proper coverage, the film quality of an amorphous silicon-based photoelectric conversion layer formed thereon is improved to suppress photo degradation.

[Photoelectric Conversion Unit]

A p-type semiconductor layer, an i-type semiconductor layer and an n-type semiconductor layer are sequentially formed on the p-type crystalline semiconductor layer 52 of the contact layer 5 to form the photoelectric conversion unit 6. For p-type, i-type and n-type semiconductor layers that form the photoelectric conversion unit, amorphous materials such as amorphous silicon, amorphous silicon carbide, amorphous silicon germanium, amorphous silicon oxides, amorphous silicon nitrides and amorphous germanium; and crystalline materials such as crystalline silicon, crystalline silicon carbide, crystalline silicon germanium, crystalline silicon oxides, crystalline silicon nitrides and crystalline germanium can be used.

The thin-film photoelectric conversion device of the present invention may include two or more photoelectric conversion units. FIG. 1 illustrates a thin-film photoelectric conversion device including two photoelectric conversion units: the amorphous silicon photoelectric conversion unit 6 with an i-type semiconductor layer (photoelectric conversion layer) 62 composed of amorphous silicon; and the crystalline silicon photoelectric conversion unit 7 with an i-type semiconductor layer (photoelectric conversion layer) 72 composed of crystalline silicon.

The method for forming semiconductor layers to be used in the amorphous photoelectric conversion unit 6 and the crystalline photoelectric conversion unit 7 is not particularly limited, but a plasma-enhanced CVD method is preferred for forming a high-quality film at a low cost.

When two or more photoelectric conversion units are included, it is preferred that the i-type semiconductor layer 62 in the photoelectric conversion unit (front photoelectric conversion unit) 6 on the light incident side (substrate 2 side) has a sensitivity to light having a wavelength of about 360 to 800 nm. Thus, the front photoelectric conversion unit 6 is preferably an amorphous photoelectric conversion unit with the i-type semiconductor layer 62 composed of an amorphous material, especially preferably an amorphous silicon photoelectric conversion unit with the i-type semiconductor layer 62 composed of amorphous silicon. The amorphous silicon photoelectric conversion unit 6 includes, for example, a p-type amorphous silicon carbide layer 61, an i-type amorphous silicon layer 62 and an n-type microcrystalline silicon layer 63 in this order from the substrate 2 side.

The p-type amorphous semiconductor layer 61 can be formed by doping an amorphous silicon-based material such as silicon, silicon carbide, a silicon oxide, a silicon nitride or silicon germanium with p-type conductivity-type determining impurity atoms such as those of boron or aluminum. In the present invention, the p-type amorphous semiconductor layer 61 is preferably made of a p-type amorphous silicon carbide. The amorphous silicon carbide is a wide band gap material, and therefore has small light absorption. Thus, when the p-type semiconductor layer is made of amorphous silicon carbide, an increased amount of light reaches the i-type semiconductor layer 62, so that an improvement of conversion characteristics can be expected. The thickness of the p-type amorphous semiconductor layer 61 is preferably 2 to 15 nm, and more preferably 5 to 10 nm for exhibiting a function as a window layer and suppressing a reduction in current due to an absorption loss etc.

Generally, when the transparent electroconductive film is made of zinc oxide, and the p-type semiconductor layer of the photoelectric conversion unit is made of silicon carbide, the contact property at the interface tends to be deteriorated. On the other hand, in the present invention, the contact layer 5 is provided between the transparent electroconductive film 4 and the photoelectric conversion unit 6, and therefore even when the p-type semiconductor layer is made of silicon carbide, a proper contact property can be exhibited to achieve high conversion efficiency.

For the i-type semiconductor layer 62, for example, an amorphous silicon-based semiconductor material can be used. Such a material is preferably amorphous silicon as an intrinsic semiconductor (hydrogenated amorphous silicon etc.). A silicon alloy such as silicon carbide or silicon germanium, or the like can also be used. The thickness of the i-type amorphous silicon layer 62 is preferably 100 to 500 nm, and more preferably 150 to 350 nm. When the thickness of the i-type amorphous silicon layer 62 falls within the above-mentioned range, photodegradation of the amorphous silicon-based material is suppressed while a necessary current is obtained. The i-type semiconductor layer 62 may be made of a weak p-type or weak n-type silicon-based semiconductor material containing a very small amount of a conductivity-type determining impurity as long as the material has a sufficient photoelectric conversion function.

The n-type semiconductor layer 63 can be formed by doping silicon, or a silicon alloy such as silicon carbide, a silicon oxide, a silicon nitride or silicon germanium with n-type conductivity-type determining impurity atoms such as those of phosphorus or nitrogen. The thickness of the n-type silicon layer 63 is not particularly limited as long as a sufficient internal electric field can be obtained. For example, when the thickness of the n-type silicon semiconductor layer 63 is 40 nm or less, a reduction in current due to an absorption loss etc. can be suppressed. Thus, the thickness of the n-type silicon layer 63 is preferably 5 to 40 nm, and more preferably 10 to 25 nm.

When the thin-film photoelectric conversion device includes another photoelectric conversion unit 7 (rear photoelectric conversion unit) between the amorphous photoelectric conversion unit 6 and the back electrode layer 8, it is preferred that the i-type semiconductor layer 72 of the rear photoelectric conversion unit 7 has a sensitivity to light having a longer wavelength as compared to the i-type semiconductor layer 62 of the front photoelectric conversion unit 6. Thus, when the front photoelectric conversion unit 6 is an amorphous photoelectric conversion unit, the rear photoelectric conversion unit 7 is preferably a crystalline photoelectric conversion unit with the i-type semiconductor layer 72 composed of a crystalline material, especially preferably a crystalline silicon photoelectric conversion unit with the i-type semiconductor layer 72 composed of crystalline silicon. The crystalline silicon photoelectric conversion unit 7 includes, for example, a p-type microcrystalline silicon layer 71, an i-type crystalline silicon layer 72 and an n-type microcrystalline silicon layer 73 in this order from the substrate 2 side.

The p-type microcrystalline silicon layer 71 of the crystalline silicon photoelectric conversion unit 7 is formed by, for example, a plasma-enhanced CVD method with silane, diborane and hydrogen as film formation gases are introduced into a chamber. The thickness of the p-type semiconductor layer 71 is preferably not less than 5 nm and not more than 50 nm, more preferably not less than 10 nm and not more than 30 nm for suppressing light absorption. The i-type crystalline silicon layer 72 is formed by introducing, for example, silane and hydrogen as film formation gases, and the thickness thereof is preferably about 0.5 to 3.5 μm. The n-type microcrystalline silicon layer 73 is formed by introducing, for example, silane, phosphine and hydrogen as film formation gases to a chamber, and the thickness thereof is preferably not less than 5 nm and not more than 50 nm, more preferably not less than 10 nm and not more than 30 nm for suppressing light absorption.

As described above, FIG. 1 shows an example in which the thin-film photoelectric conversion device includes two photoelectric conversion units, the amorphous silicon photoelectric conversion unit 6 and the crystalline silicon photoelectric conversion unit 7 as photoelectric conversion units, but the thin-film photoelectric conversion device of the present invention is not limited thereto, and may have a configuration of, for example, amorphous silicon photoelectric conversion unit/amorphous silicon photoelectric conversion unit or amorphous silicon photoelectric conversion unit/amorphous silicon photoelectric conversion unit/crystalline silicon photoelectric conversion unit.

Figure 3:
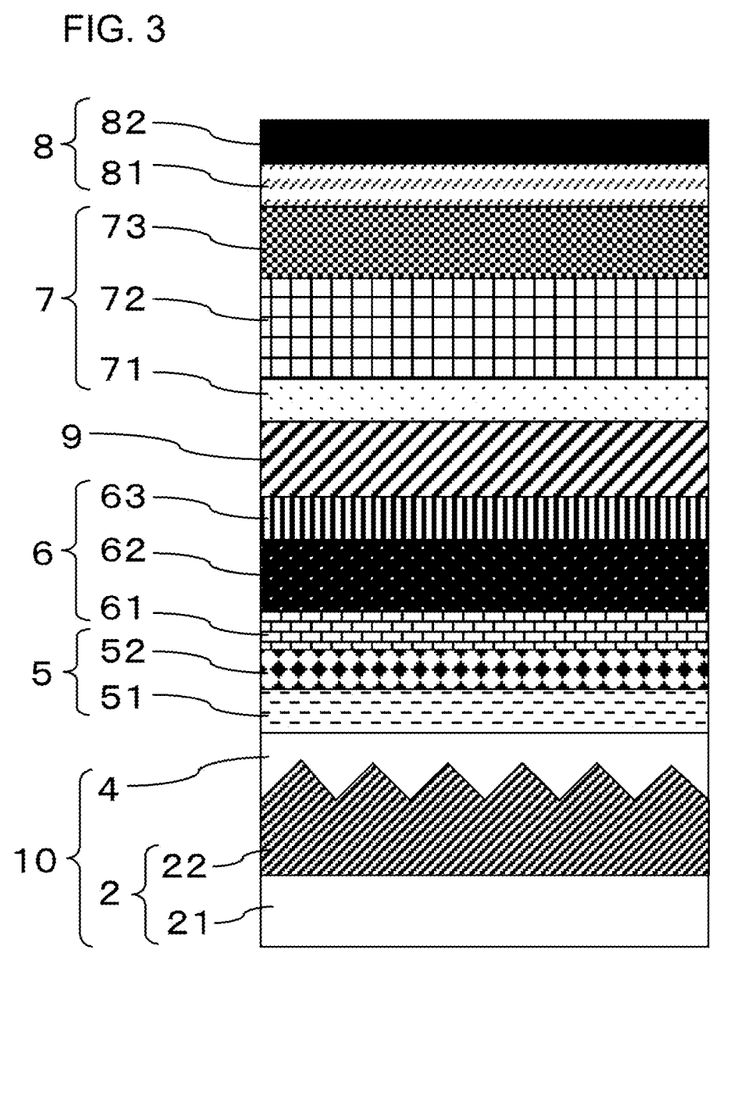
FIG. 3 is a schematic sectional view of a double-junction-type thin-film silicon solar cell (thin-film photoelectric conversion device) of one aspect of the present invention.

When two or more photoelectric conversion units are included, an intermediate reflection layer 9 may be formed between the photoelectric conversion units as shown in FIG. 3. Preferably, the intermediate reflection layer 9 is composed of an n-type silicon-based composite layer etc. as disclosed in, for example, WO 2005/011001. As the n-type silicon-based composite layer, for example, one containing a silicon crystalline phase in an amorphous alloy of silicon and oxygen and having a low refractive index (e.g. a refractive index of 2.5 or less) and high electroconductivity is preferably used. Light can be hereby reflected to the front photoelectric conversion unit side to enhance light utilization efficiency without deteriorating the contact property. The intermediate reflection layer 9 may be a single layer, or may include two or more layers. For example, an intermediate reflection layer formed by stacking a plurality of layers having different refractive indexes can also be used. Further, the conductivity-type layer of the photoelectric conversion unit (e.g. the n-type semiconductor layer of the front photoelectric conversion unit) can be made to have a function as an intermediate reflection layer.

[Back Electrode Layer]

The back electrode layer 8 is formed on the thin-film photoelectric conversion unit. The back electrode layer 8 can be formed of a metal layer alone, but it is preferred to stack a transparent conductive oxide layer 81 and a metal layer 82 for increasing the reflectance by a back electrode and improving the contact property between the photoelectric conversion unit and the back electrode.

For the transparent conductive oxide layer 81, for example, zinc oxide, ITO or the like can be used. Particularly, zinc oxide is preferred because it has both a high transmittance and a reduced cost. The transparent conductive oxide layer 81 is prepared by a sputtering method or a CVD method. For the metal layer 82, for example, Ag, Al, Ni or the like can be used. Particularly, Ag is preferably used in view of a high reflectance. The metal layer 82 can be formed by a sputtering method, a vapor deposition method or the like.

The thin-film photoelectric conversion device of the present invention can be prepared in the manner described above. The thin-film solar cell can also be modularized and put into practical use. For example, a filling resin and a sealing plate are provided on a back electrode, and a cell is sealed with the substrate and the sealing plate to perform modularization. In modularization, it is preferred that each layer is patterned by laser light irradiation or the like to divide the layer into a plurality of cells, and the plurality of cells are connected in series or in parallel to perform integration.

EXAMPLES

Hereinafter, thin-film photoelectric conversion devices from some Examples of the present invention will be described along with some Comparative Examples with reference to the drawings. It is to be noted that the present invention is not limited to the Examples below.

The thickness of a thin film formed in this example was calculated based on a film formation time on the assumption that the film is formed at a film formation rate identical to a film formation rate determined by measuring a thickness of a film, which was formed on a glass substrate under the same conditions, using a spectroscopic ellipsometer (trade name: M2000; manufactured by J.A. Woollam Corporation). The refractive index is a value at a wavelength of 600 nm, which was measured by the spectroscopic ellipsometer.

For the dark conductivity, a coplanar-type electrode was attached to a film formed on a glass substrate, and a current passing in a direction parallel to the substrate surface was measured using PICOAMMETER 6487 (manufactured by KEITHLEY Inc.). The sheet resistance was determined using a resistivity meter Loresta GP MCT-610 (manufactured by Mitsubishi Chemical Corporation).

Whether the semiconductor layer was crystalline or amorphous was determined by a Raman scattering method. A dependency of a Raman scattering intensity on a number of waves was measured using Laser Raman Spectrophotometer NRS-1000 (manufactured by JASCO Corporation), and a layer having a peak of around 520 cm$^{-1}$ was determined to be crystalline, while a layer having a broad peak of around 480 cm$^{-1}$ was determined to be amorphous.

Example 1

As Example 1, a double-junction-type thin-film photoelectric conversion device as shown in FIG. 1 was prepared. First, a SiO$_2$ layer was formed as an underlying layer on a 0.7 mm-thick and 125 mm-square glass substrate using a sol-gel method. A layer having a thickness of 1000 nm was formed by a spin coating method using as a coating solution a SiO$_2$ sol-gel solution generally used as a spin-on-glass (SOG) material.

The whole substrate provided with the underlying layer was pre-baked on a hot plate at 60° C. for 20 minutes to semi-cure the underlying layer. This substrate was brought in an imprinting device, a mold 3 with an irregular structure formed on a surface of a single-crystalline silicon wafer was pressed against the substrate, and the irregular structure was transferred to the underlying layer by a nanoimprinting method, thereby obtaining an underlying layer 22 having an irregular structure on a surface thereof. The haze ratio of the underlying layer 22 after the formation of the irregular structure was 50%.

For the mold 3, the single-crystalline silicon wafer was degreased and washed by ultrasonic irradiation in acetone and ethanol, then immersed in an aqueous potassium hydroxide/isopropyl alcohol mixed solution, and etched for a certain time to form an irregular structure on a surface thereof.

The substrate with an irregular structure formed on the underlying layer was fired under an air atmosphere at 400° C. for 1 hour. When the substrate was bent and cut, and the cross-sectional shape of the underlying layer was observed over a range with a cross-sectional length of 3.5 μm using a transmission electron microscope (TEM), projection portions of the irregular structure were mutually adjacent, the top-bottom distance of irregularities fell within a range of 200 to 600 nm, and the projection peak-to-peak distance fell within a range of 300 to 1200 nm. When the transmittance of the substrate was measured by a spectrophotometer with light made incident from a side where an irregular structure was not formed, a transmittance of 85% or more was shown over a wavelength range of 400 to 1200 nm.

On the underlying layer 22 of the substrate, a transparent electroconductive film 4 composed of zinc oxide was formed with a thickness of 1.5 μm. First, the substrate was brought in a deposition chamber, and the substrate temperature was adjusted to 150° C. Thereafter, 1000 sccm of hydrogen, 500 sccm of diborane diluted to 5000 ppm with hydrogen, 100 sccm of water and 50 sccm of diethylzinc were introduced into the deposition chamber, and a film was formed by CVD at a pressure of 10 Pa in the deposition chamber.

Figure 4:
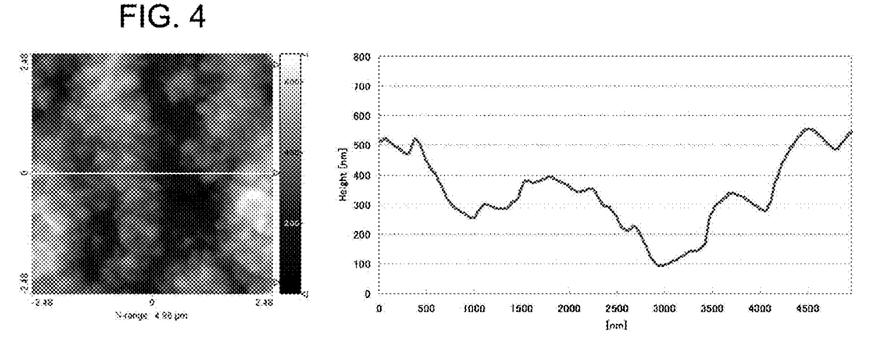
FIG. 4 is a view showing an AFM (atomic force microscope) image of a substrate with a transparent electroconductive film in the Examples, and a cross-sectional shape obtained from the AFM image.

The substrate after formation of the transparent electroconductive film was brought in a RIE device, and only Ar was introduced as an etching gas at room temperature to perform plasma etching. Etching conditions included an Ar flow rate of 50 sccm, a pressure of 5 Pa and a plasma power of 100 W, and the treatment was performed for 20 minutes. The results of measuring the surface of the substrate with a transparent electroconductive film after the plasma etching treatment using an AFM (atomic force microscope) are shown in FIG. 4.

The substrate with a transparent electroconductive film 10 was introduced into a plasma-enhanced CVD apparatus, and as a contact layer 5, a non-doped intrinsic crystalline semiconductor layer 51 (i: μc-Si) having a thickness of 1 nm and a boron-doped p-type crystalline semiconductor layer 52 (p: μc-SiO) having silicon oxide as a main component and having a thickness of 7 nm were formed by a plasma-enhanced CVD method. The intrinsic crystalline semiconductor layer was formed under a pressure of 266 Pa and a power density of 0.4 W/cm$^2$ with 600 sccm of hydrogen and 3 sccm of silane being introduced into a deposition chamber at a substrate temperature of 190° C. The p-type crystalline semiconductor layer was formed under a pressure of 930 Pa and a power density of 0.4 W/cm$^2$ with 1000 sccm of hydrogen, 2 sccm of silane, 2.5 sccm of diborane diluted to 5000 ppm with hydrogen, and 4.0 sccm of carbon dioxide being introduced into a deposition chamber at a substrate temperature of 190° C.

On the contact layer 5 were further formed a boron-doped p-type amorphous silicon carbide (a-SiC) layer 61 with a thickness of 10 nm, a non-doped i-type amorphous silicon layer (photoelectric conversion layer) 62 with a thickness of 300 nm and a phosphorus-doped n-type microcrystalline silicon layer 63 with a thickness of 20 nm to form an amorphous silicon photoelectric conversion unit 6.

On the amorphous silicon photoelectric conversion unit 6 were formed a boron-doped p-type microcrystalline silicon layer 71 with a thickness of 15 nm, a non-doped i-type crystalline silicon layer 72 with a thickness of 0.7 μm and a phosphorus-doped n-type microcrystalline silicon layer 73 with a thickness of 20 nm by a plasma-enhanced CVD method to form a crystalline silicon photoelectric conversion unit 7. Further, as a back electrode layer 8, a zinc oxide layer 81 with a thickness of 80 nm and an Ag layer 82 with a thickness of 300 nm were formed by a sputtering method.

When the p-type crystalline semiconductor layer 52 was formed on a glass under the same conditions as the film formation conditions in the Example, and a refractive index and a dark conductivity of the p-type crystalline semiconductor layer were measured, the refractive index was 2.8, and the dark conductivity was $7.9 \times 10^{-7}$ S/cm. When a dependency of a Raman scattering intensity on a wave number was measured, the p-type crystalline semiconductor layer had a peak of around 520 cm$^{-1}$, and was therefore confirmed to be crystalline. Therefore, it is considered that the p-type crystalline semiconductor layer in the contact layer in Example 1 has a similarly high crystallinity.

Example 2

Figure 5:
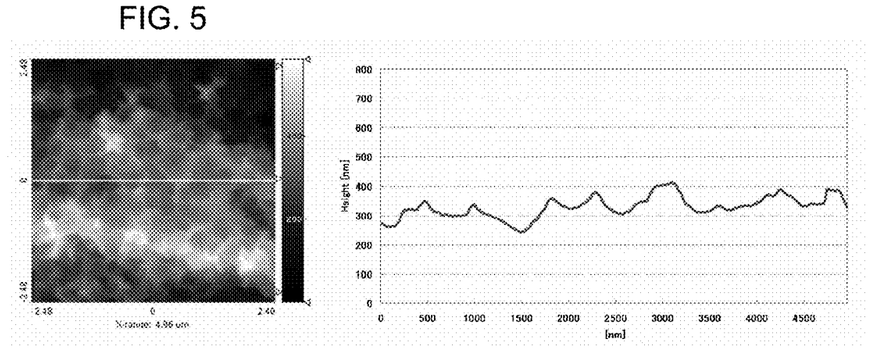
FIG. 5 is a view showing an AFM (atomic force microscope) image of a substrate with a transparent electroconductive film in the Examples, and a cross-sectional shape obtained from the AFM image.

Example 2 was different from Example 1 only in that the time for etching by RIE after the formation of the transparent electroconductive film 4 was changed to 35 minutes. Otherwise, in the same manner as in Example 1, a double-junction-type thin-film silicon solar cell was formed. The results of an AFM observation of the surface after the etching of the transparent electroconductive film in Example 2 are shown in FIG. 5. It is apparent that etching proceeded further as compared to Example 1 because the etching time was increased.

Example 3

Figure 6:
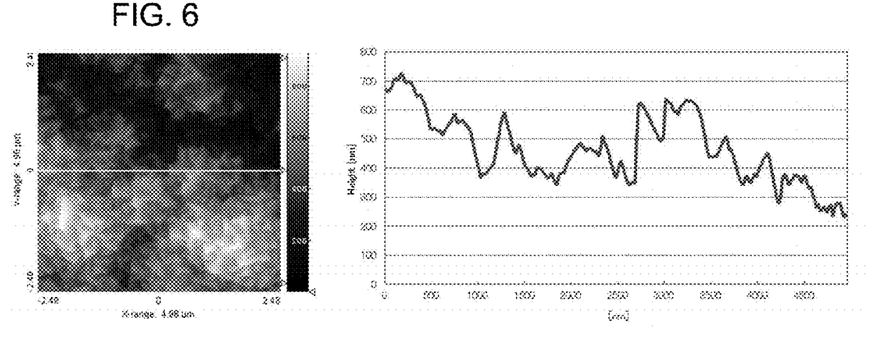
FIG. 6 is a view showing an AFM (atomic force microscope) image of a substrate with a transparent electroconductive film in the Examples, and a cross-sectional shape obtained from the AFM image.

Example 3 was different from Example 1 only in that RIE was not performed after the formation of the transparent electroconductive film 4. Otherwise, in the same manner as in Example 1, a double-junction-type thin-film silicon solar cell was formed. The results of an AFM observation of the surface of the transparent electroconductive film in Example 3 are shown in FIG. 6.

Comparative Example 1

Comparative Example 1 was different from Example 1 in that the contact layer was not formed between the transparent electroconductive film and the amorphous silicon photoelectric conversion unit. That is, in Comparative Example 1, the p-type amorphous silicon carbide (a-SiC) layer 61 of the amorphous silicon photoelectric conversion unit 6 was formed directly on the transparent electroconductive film 4 of the substrate with a transparent electroconductive film 10. Otherwise, in the same manner as in Example 1, a double-junction-type thin-film silicon solar cell was formed.

Comparative Example 2

Comparative Example 2 was different from Example 3 in that the contact layer was not formed between the transparent electroconductive film and the amorphous silicon photoelectric conversion unit. That is, in Comparative Example 2, RIE was not performed after the formation of the transparent electroconductive film, and the p-type amorphous silicon carbide (a-SiC) layer 61 of the amorphous silicon photoelectric conversion unit 6 was formed directly on the transparent electroconductive film 4.

Comparative Example 3

Comparative Example 3 was different from Example 1 in that the contact layer 5 had no intrinsic crystalline semiconductor layer, and included the p-type crystalline semiconductor layer 52. That is, in Comparative Example 3, the intrinsic crystalline semiconductor layer 51 was not formed, and the boron-doped p-type crystalline semiconductor layer 52 (p-SiO) containing silicon oxide as a main component was formed with a thickness of 20 nm on the transparent electroconductive film 4, and the p-type amorphous silicon carbide (a-SiC) layer 61 of the amorphous silicon photoelectric conversion unit 6 was formed thereon. Otherwise in the same manner as in Example 1, a double-junction-type thin-film silicon solar cell was formed.

Comparative Example 4

Comparative Example 4 was different from Example 3 in that, as the p-type crystalline semiconductor layer of the contact layer, silicon was deposited in place of a silicon oxide. That is, in Comparative Example 4, a boron-doped p-type crystalline silicon semiconductor layer (p: μc-Si) having silicon as a main component and having a thickness of 7 nm was formed as a contact layer on the non-doped intrinsic crystalline semiconductor layer 51 (i: μc-Si) having a thickness of 1 nm by a plasma-enhanced CVD method.

[Evaluation]
(Evaluation of Initial Characteristics)

The double-junction-type thin-film silicon solar cells of Examples 1 to 3 and Comparative Examples 1 to 4 were separated into regions of 1 cm$^2$ by laser scribing to prepare cells for evaluation. Laser scribing was performed by making the second harmonic wave of a Nd—YVO4 laser, the output intensity distribution of which was made uniform, incident from the glass side to separate layers of from the back electrode layer to the photoelectric conversion layer in the depth direction. Processing conditions included a Q switch frequency of 20 kHz, a processing speed of 400 mm/sec, a processing point power of 0.3 W and a beam diameter of 30 μm. The cell for evaluation was irradiated with artificial sunlight with an energy density of 100 mW/cm$^2$ at 25° C. using a solar simulator having a spectrum distribution of AM 1.5, and conversion characteristics were measured.

(Evaluation of Photostability)

The cell for evaluation after measurement of the initial characteristics was irradiated with light in a light amount of 500 mW/cm$^2$ for 20 hours to conduct an accelerated light irradiation test, and conversion characteristics after photostabilization were measured under conditions similar to those in the measurement of initial characteristics (evaluation of photostability was not performed for Comparative Example 4).

Table 1 shows the configuration of the contact layer, the etching time and surface shape of the transparent electroconductive film, and the initial conversion characteristics and conversion characteristics after photostabilization of the cell in each of Examples 1 to 3 and Comparative Examples 1 to 4.

TABLE 1

| | Configuration of contact layer | Transparent electroconductive film | | | | | | Initial characteristics of cell | | | | Characteristics of cell after photostabilization | | | | Retention rate (%) |
|---|---|---|---|---|---|---|---|---|---|---|---|---|---|---|---|---|
| | | Etching time (minutes) | Ra (nm) | Sdr (%) | Top-bottom distance (nm) | Top-top distance (nm) | Sheet resistance ($\Omega$) | Voc (V) | Jsc (mA/cm$^2$) | F.F. (%) | Eff. (%) | Voc (V) | Jsc (mA/cm$^2$) | F.F. (%) | Eff. (%) | |
| Example 1 | i: μc-Si/ p: μc-SiO | 20 | 95.2 | 20.9 | 20-300 | 50-500 | 12 | 1.37 | 10.5 | 73.5 | 10.57 | 1.35 | 10.1 | 70.0 | 9.54 | 90.30 |
| Example 2 | i: μc-Si/ p: μc-SiO | 35 | 88.4 | 17.7 | 20-150 | 50-500 | 13 | 1.38 | 10.4 | 74.0 | 10.62 | 1.34 | 10.0 | 71.0 | 9.51 | 89.59 |
| Example 3 | i: μc-Si/ p: μc-SiO | 0 | 157 | 95.6 | 40-400 | 50-500 | 13 | 1.35 | 10.5 | 71.5 | 10.14 | 1.30 | 10.1 | 68.0 | 8.93 | 88.05 |
| Comparative Example 1 | — | 20 | 95.2 | 20.9 | 20-300 | 50-500 | 12 | 1.35 | 10.6 | 66.0 | 9.44 | 1.30 | 10.2 | 60.0 | 7.96 | 84.28 |
| Comparative Example 2 | — | 0 | 157 | 95.6 | 40-400 | 50-500 | 13 | 1.36 | 10.5 | 68.2 | 9.74 | 1.31 | 10.2 | 62.5 | 8.35 | 85.75 |
| Comparative Example 3 | p: μc-SiO | 20 | 95.2 | 20.9 | 20-300 | 50-500 | 12 | 1.37 | 10.5 | 70.2 | 10.10 | 1.32 | 10.2 | 65.0 | 8.75 | 86.65 |
| Comparative Example 4 | i: μc-Si/ p: μc-Si | 0 | 157 | 95.6 | 40-400 | 50-500 | 13 | 1.34 | 10.3 | 70.5 | 9.73 | | N.D. | | | |

(Comparison of Initial Characteristics)

When the initial characteristics of Examples 1 to 3 are compared to those of Comparative Examples 1 and 2, it is apparent that in Examples 1 to 3, which have a contact layer, FF is improved and the conversion efficiency (Eff) is accordingly improved as compared to Comparative Examples 1 and 2, which have no contact layer. This may be because a proper electrical junction was formed since a contact layer was formed between the transparent electroconductive film and the p-type amorphous silicon carbide semiconductor layer of the photoelectric conversion unit.

In Comparative Example 3, where the contact layer had no intrinsic crystalline semiconductor layer, and had only a p-type crystalline silicon oxide semiconductor layer, FF was improved as compared to Comparative Example 1, which had no contact layer, but FF was lower as compared to Examples 1 to 3, and characteristics were not sufficiently improved. From these results, it is considered that in the Examples, the intrinsic crystalline semiconductor layer of the contact layer is in contact with the transparent electroconductive film to form a proper electrical junction, and acts as a seed layer for the p-type crystalline silicon oxide semiconductor layer formed thereon, thus contributing to the improvement of film quality.

In Comparative Example 4, where the p-type crystalline semiconductor layer of the contact layer was made of silicon, FF was improved as compared to Comparative Example 1, but FF was lower as compared to Examples 1 to 3, and Voc and Jsc decreased. From this result, it is considered that in Examples 1 to 3, the p-type crystalline semiconductor layer is made of a silicon alloy, and therefore has a proper coverage for the intrinsic crystalline semiconductor layer, so that Voc and FF are improved. It is considered that, since a silicon alloy has smaller light absorption as compared to silicon, a light absorption loss caused by the contact layer is small, leading to the improvement of conversion efficiency in Examples 1 to 3.

Comparison of Examples 1 to 3 with reference to Table 1 and FIGS. 4 to 6 shows that, when the etching time is increased, Ra and Sdr decrease, and Voc and FF are accordingly improved. From these results, it is considered that, by etching the transparent electroconductive film, the shape of recess portions in particular is changed from a pyramidal shape (V shape) to a curved shape (U shape), so that the occurrence of in-film defects in the contact layer and the photoelectric conversion unit formed on the transparent electroconductive film is suppressed, and the coverage is improved. From these results, it is considered that, by etching, the surface shape of the transparent electroconductive film is optimized to suppress the occurrence of linear defects in the film growth of a semiconductor layer formed on the transparent electroconductive film, resulting in an improvement of conversion characteristics.

Comparing Example 3 to Comparative Example 2, it is apparent that, even when the etching of the transparent electroconductive film is not performed, FF is improved by providing the contact layer according to the present invention.

Comparison of Characteristics after Photostabilization

As is apparent in Examples 1 to 3, the ratio of the conversion efficiency after photostabilization to the initial conversion efficiency (retention rate) is higher as compared to Comparative Examples 1 to 3, and photodegradation is suppressed, leading to a high retention rate. This may be because the film quality of the amorphous silicon photoelectric conversion unit formed on the contact layer was improved to suppress the photodegradation of amorphous silicon.

Thus, as is evident from the comparison of Examples 1 to 3 to Comparative Examples 1 to 4, the thin-film photoelectric conversion device of the present invention including a contact layer, which includes an intrinsic crystalline semiconductor layer and a p-type crystalline silicon alloy semiconductor layer, between a zinc oxide transparent electroconductive film and a p-layer of a photoelectric conversion unit, is excellent in its initial conversion characteristics, and has a high retention rate after photostabilization.

Example and Comparative Example for Double-Junction-Type Solar Cell Including Intermediate Reflection Layer Example 4

In Example 4, a double-junction-type thin-film photoelectric conversion device as shown in FIG. 3 was prepared. A substrate with a transparent electroconductive film 10 was formed in the same manner as in Example 1, and a contact layer was formed thereon. On the contact layer were formed a boron-doped p-type amorphous silicon carbide (a-SiC) layer 61 with a thickness of 10 nm, a non-doped i-type amorphous silicon layer (photoelectric conversion layer) 62 separated into regions of 1 $cm^2$ by laser scribing to prepare the cells for evaluation, and measurement of conversion characteristics and evaluation of photostability were performed. The results are shown in Table 2.

TABLE 2

| | | Transparent electroconductive film | | | | | Initial characteristics of cell | | | | Characteristics of cell after photostabilization | | | | Retention rate (%) |
|---|---|---|---|---|---|---|---|---|---|---|---|---|---|---|---|
| | Configuration of contact layer | Etching time (minutes) | Ra (nm) | Sdr (%) | Top-bottom distance (nm) | Peak-to-peak distance (nm) | Sheet resistance (Ω) | Voc (V) | Jsc (mA/$cm^2$) | F.F. (%) | Eff. (%) | Voc (V) | Jsc (mA/$cm^2$) | F.F. (%) | Eff. (%) | |
| Example 4 | i: μc-Si/ p: μc-SiO | 20 | 95.2 | 20.9 | 20-300 | 50-500 | 12 | 1.38 | 12.1 | 73.5 | 12.27 | 1.35 | 11.8 | 70.0 | 11.2 | 90.86 |
| Comparative Example 5 | — | 20 | 95.2 | 20.9 | 20-300 | 50-500 | 12 | 1.35 | 12.2 | 67.0 | 11.03 | 1.30 | 11.9 | 60.0 | 9.28 | 84.11 | with a thickness of 250 nm and a phosphorus-doped n-type microcrystalline silicon layer 63b with a thickness of 20 nm to form an amorphous silicon photoelectric conversion unit 6, and a phosphorus-doped n-type silicon-based composite layer (intermediate reflection layer) 9 was formed thereon with a thickness of 70 nm. Conditions for forming the intermediate reflection layer 9 (n-type silicon-based composite layer) included a pressure of 1000 Pa and a power density of 0.1 W/$cm^2$ with 1000 sccm of hydrogen, 5 sccm of silane, 2.5 sccm of diborane diluted to 5000 ppm with hydrogen, and 20 sccm of carbon dioxide being introduced into a deposition chamber at a substrate temperature of 200° C. The silicon composite layer is a layer containing a silicon crystalline phase dispersed in a parent phase of an amorphous silicon oxide and having a low refractive index and a high electroconductivity, and acting as an intermediate reflection layer.

On the intermediate reflection layer 9 were formed a boron-doped p-type microcrystalline silicon layer 71 with a thickness of 15 nm, a non-doped i-type crystalline silicon layer 72 with a thickness of 2.5 μm and a phosphorus-doped n-type microcrystalline silicon layer 73 with a thickness of 20 nm by a plasma-enhanced CVD method to form a crystalline silicon photoelectric conversion unit 7. Further, as a back electrode layer 8, a zinc oxide layer 81 with a thickness of 80 nm and an Ag layer 82 with a thickness of 300 nm were formed by a sputtering method.

Comparative Example 5

Comparative Example 5 was different from Example 4 in that the contact layer was not formed between the transparent electroconductive film and the amorphous silicon photoelectric conversion unit. That is, in Comparative Example 5, an amorphous silicon photoelectric conversion unit including the p-type amorphous silicon carbide (a-SiC) layer 61, the i-type amorphous silicon layer 62 and the n-type microcrystalline silicon layer 63 was formed directly on the transparent electroconductive film 4 of the substrate with a transparent electroconductive film 10, and the intermediate reflection layer 9, the crystalline silicon photoelectric conversion unit 7 and the back electrode layer 8 were formed thereon.

(Evaluation)

Similarly to the evaluation in Examples 1 to 3 and Comparative Examples 1 to 4, the double-junction-type thin-film silicon solar cells including an intermediate reflection layer in Example 4 and Comparative Example 5 were According to the results shown in Table 2, comparison of Example 4 to Comparative Example 5 shows that, by providing a specific contact layer, FF is improved, and the conversion efficiency (Eff) is accordingly improved similarly as in the comparison of Example 1 to Comparative Example 1. In Example 4, the retention rate tended to be further improved as compared to Example 1. This may be because the film quality of the amorphous silicon photoelectric conversion unit formed on the contact layer was improved to suppress the photodegradation of amorphous silicon, and in addition, the film quality of the intermediate reflection layer (n-type silicon composite layer) formed on the photoelectric conversion layer was improved.

DESCRIPTION OF REFERENCE SIGNS

10 substrate with transparent electroconductive film
2 substrate
21 transparent insulating base
22 underlying layer
4 transparent electroconductive film
5 contact layer
51 intrinsic crystalline semiconductor layer
52 p-type crystalline semiconductor layer
6 amorphous photoelectric conversion unit
61 p-type semiconductor layer
62 i-type amorphous semiconductor layer
63 n-type semiconductor layer
7 crystalline photoelectric conversion unit
71 p-type semiconductor layer
72 i-type crystalline semiconductor layer
73 n-type semiconductor layer
8 back electrode layer
81 transparent conductive oxide layer
82 metal layer
9 intermediate reflection layer
3 mold

The invention claimed is:
1. A thin-film photoelectric conversion device comprising:
    a transparent electroconductive film having zinc oxide as a main component;
    a contact layer;
    a photoelectric conversion unit having a p-type semiconductor layer, an i-type semiconductor layer and an n-type semiconductor layer in this order; and a back electrode layer, in this order, on one main surface of a substrate, wherein the contact layer includes an intrinsic crystalline silicon semiconductor layer and a p-type crystalline semiconductor layer in this order from the substrate side, the p-type crystalline semiconductor layer of the contact layer is a layer having as a main component a silicon alloy selected from the group consisting of a silicon oxide; a silicon nitride; silicon carbide; and silicon germanium, and the intrinsic crystalline silicon semiconductor layer of the contact layer and the transparent electroconductive film are in contact with each other, wherein the p-type semiconductor layer of the photoelectric conversion unit and the p-type crystalline semiconductor layer of the contact layer are separate layers.

2. The thin-film photoelectric conversion device according to claim 1, wherein the p-type crystalline semiconductor layer of the contact layer is a layer having a silicon oxide as a main component.

3. The thin-film photoelectric conversion device according to claim 1, wherein the substrate comprises a transparent insulating base and an underlying layer, the underlying layer is formed on the transparent electroconductive film side of the transparent insulating base, the underlying layer includes an irregular structure on a surface on the transparent electroconductive film side, and the irregular structure has a top-bottom distance of 100 to 1000 nm, and a projection peak-to-peak distance of 200 to 2000 nm.

4. The thin-film photoelectric conversion device according to claim 1, wherein the intrinsic crystalline silicon semiconductor layer of the contact layer has a thickness of 0.2 to 5 nm.

5. The thin-film photoelectric conversion device according to claim 1, wherein the p-type crystalline semiconductor layer of the contact layer has a thickness of 3 to 15 nm.

6. The thin-film photoelectric conversion device according to claim 1, wherein the p-type crystalline semiconductor layer of the contact layer has a dark conductivity of $10^{-8}$ to $10^{-1}$ S/cm, and a refractive index of 1.7 to 3.0 to light having a wavelength of 600 nm.

7. The thin-film photoelectric conversion device according to claim 1, wherein the p-type semiconductor layer of the photoelectric conversion unit is a p-type amorphous silicon carbide layer.

8. The thin-film photoelectric conversion device according to claim 1, further comprising, between the photoelectric conversion unit and the back electrode layer, another photoelectric conversion unit.

9. A solar cell module comprising the thin-film photoelectric conversion device according to claim 1.

10. A method of manufacturing a thin-film photoelectric conversion device comprising:

forming on one main surface of a substrate a transparent electroconductive film having zinc oxide as a main component;

forming an intrinsic crystalline silicon semiconductor layer and a p-type crystalline semiconductor layer in this order on the transparent electroconductive film to form a contact layer;

forming a p-type semiconductor layer, an i-type semiconductor layer and an n-type semiconductor layer in this order on the contact layer to form a photoelectric conversion unit; and forming a back electrode layer, wherein the p-type semiconductor layer of the photoelectric conversion unit and the p-type crystalline semiconductor layer of the contact layer are separate layers, the intrinsic crystalline silicon semiconductor layer of the contact layer and the transparent electroconductive film are in contact with each other, the p-type crystalline semiconductor layer of the contact layer is a layer having as a main component a silicon alloy selected from the group consisting of a silicon oxide; a silicon nitride; silicon carbide; and silicon germanium, and the intrinsic crystalline silicon semiconductor layer and the p-type crystalline semiconductor layer of the contact layer are formed by a plasma-enhanced CVD method.

11. The method of manufacturing the thin-film photoelectric conversion device according to claim 10, wherein after formation of the transparent electroconductive film having zinc oxide as a main component, a surface thereof is subjected to an etching treatment in the step of forming the transparent electroconductive film.

12. The method of manufacturing the thin-film photoelectric conversion device according to claim 11, wherein the etching treatment is plasma etching.

* * * * *